United States Patent
Oka et al.

(10) Patent No.: US 6,664,127 B2
(45) Date of Patent: *Dec. 16, 2003

(54) METHOD OF MANUFACTURING MULTI-LAYER PRINTED WIRING BOARD

(75) Inventors: Seiji Oka, Tokyo (JP); Satoshi Yanaura, Tokyo (JP); Yasuo Kawashima, Tokyo (JP); Takeshi Muraki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 91 days.

This patent is subject to a terminal disclaimer.

(21) Appl. No.: 09/875,250

(22) Filed: Jun. 7, 2001

(65) Prior Publication Data

US 2002/0016018 A1 Feb. 7, 2002

(30) Foreign Application Priority Data

Jul. 7, 2000 (JP) .......................... 2000-206034

(51) Int. Cl.⁷ .............................................. H01L 21/00
(52) U.S. Cl. ...................... 438/64; 438/778; 438/613; 438/612; 438/584; 438/624
(58) Field of Search ......................... 438/64, 778, 613, 438/612, 618, 584, 620, 624, 622, 616, 597, 615

(56) References Cited

U.S. PATENT DOCUMENTS

| 6,096,411 | A | * | 8/2000 | Nakatani et al. | ............. | 428/209 |
| 6,359,035 | B1 | * | 3/2002 | Ono et al. | ................. | 523/339 |
| 6,451,710 | B1 | * | 9/2002 | Oka et al. | ................... | 438/778 |

FOREIGN PATENT DOCUMENTS

JP            60-21619 A        1/1994

* cited by examiner

*Primary Examiner*—Matthew Smith
*Assistant Examiner*—Igwe U. Anya
(74) *Attorney, Agent, or Firm*—Leydig, Voit & Mayer, LTD

(57) ABSTRACT

In a method of manufacturing multi-layer printed wiring board, an uncured resin sheet is laminated on both surfaces of a printed wiring board having one or more layers, an organic cover film having a release property is laminated on the surfaces of the uncured resin sheets on upper and lower sides of the printed wiring board, a position of the printed wiring board is irradiated with a laser beam from the surface of the organic cover film to form a non-through hole that reaches a metal land for electrically conducting the layers of the inner printed wiring board, the non-through hole is filled with a thermosetting electrically conducting paste which is then half-cured, and the organic cover film is peeled off.

5 Claims, 2 Drawing Sheets

METHOD OF MANUFACTURING MULTI-LAYER PRINTED WIRING BOARD

BACKGROUND OF THE INVENTION

1. Field of the Invention

The present invention relates to a method of manufacturing highly dense multi-layer printed wiring board by using the laser drilling.

2. Description of the Related Art

FIG. 2 shows a method of manufacturing a printed wiring board by using conventional laser drilling disclosed in Japanese Laid-Open Patent Publication Hei. 6-21619. According to the conventional method of manufacturing printed wiring board, perdetermined holes are drilled in a laminated base member 12 (hereinafter also referred to as prepreg) having a cover film 1 using a laser beam to form through holes 13. Next, a copper foil 8 is provisionally laminated on the laminated base member 12 by hot pressing, and the through holes 13 are filled with conductive paste 6 using a squeegee 14. The cover film 1 is then peeled off, and another copper foil 8' is provisionally laminated thereon by hot pressing. Finally, the copper foils 8 and 8' are patterned by etching to form circuit conductors 15 and 15'.

In the conventional method of manufacturing the printed wiring board, the circuit conductor is formed without curing the conductive paste provided for interlayer connection. Therefore, the resin contained in the prepreg flows through the step of heating, or is cured and contracts when it is cooled. Therefore, the wiring layer is distorted causing a deviation in position of the terminal region (hereinafter also referred to as a land) of the circuit conductor and dexlines in the reliability of conduction. Therefore, the wiring pattern is not finely formed, and accuracy of laser drilling is not utilized enough, imposing a limitation on the density of the printed wiring board.

SUMMARY OF THE INVENTION

This invention was accomplished in order to solve the above problem, and provides a method of manufacturing multi-layer printed wiring board, which suppresses deviation in position caused by compression and heating in the step of laminating interlayer insulating layers of the multi-layer printed wiring board, accomplishing a high precision in the laser drilling, and accomplishing the wiring of a higher density.

The method of producing multi-layer printed wiring board of this invention comprises the steps of:

(a) stacking to adhere an adhesive uncured resin sheet on at least one surface of an inner base plate having wiring layers on both surfaces thereof;
(b) irradiating a predetermined portion of said uncured resin sheet with a laser beam to form, in said uncured resin sheet, a through hole which is tapered in cross section to expose a connection portion of said wiring layer of said inner base plate;
(c) filling said through hole with a conductive material to form an interlayer conductor to render the front surface and the back surface of said uncured resin sheet conductive to each other;
(d) stacking to adhere a conductive film on the front surface of said uncured resin sheet containing the portion of forming said interlayer conductor;
(e) curing said uncured resin sheet; and
(f) patterning said conductive film into a predetermined wiring shape.

The method of producing multi-layer printed wiring board of this invention may further include the steps of stacking a non-adhesive resin sheet on the uncured resin sheet prior to irradiating the uncured resin sheet with the laser beam, and peeling off the non-adhesive resin sheet after the interlayer conductor has been formed.

DETAILED DESCRIPTION OF THE PREFERRED EMBODIMENT

Figure 1:
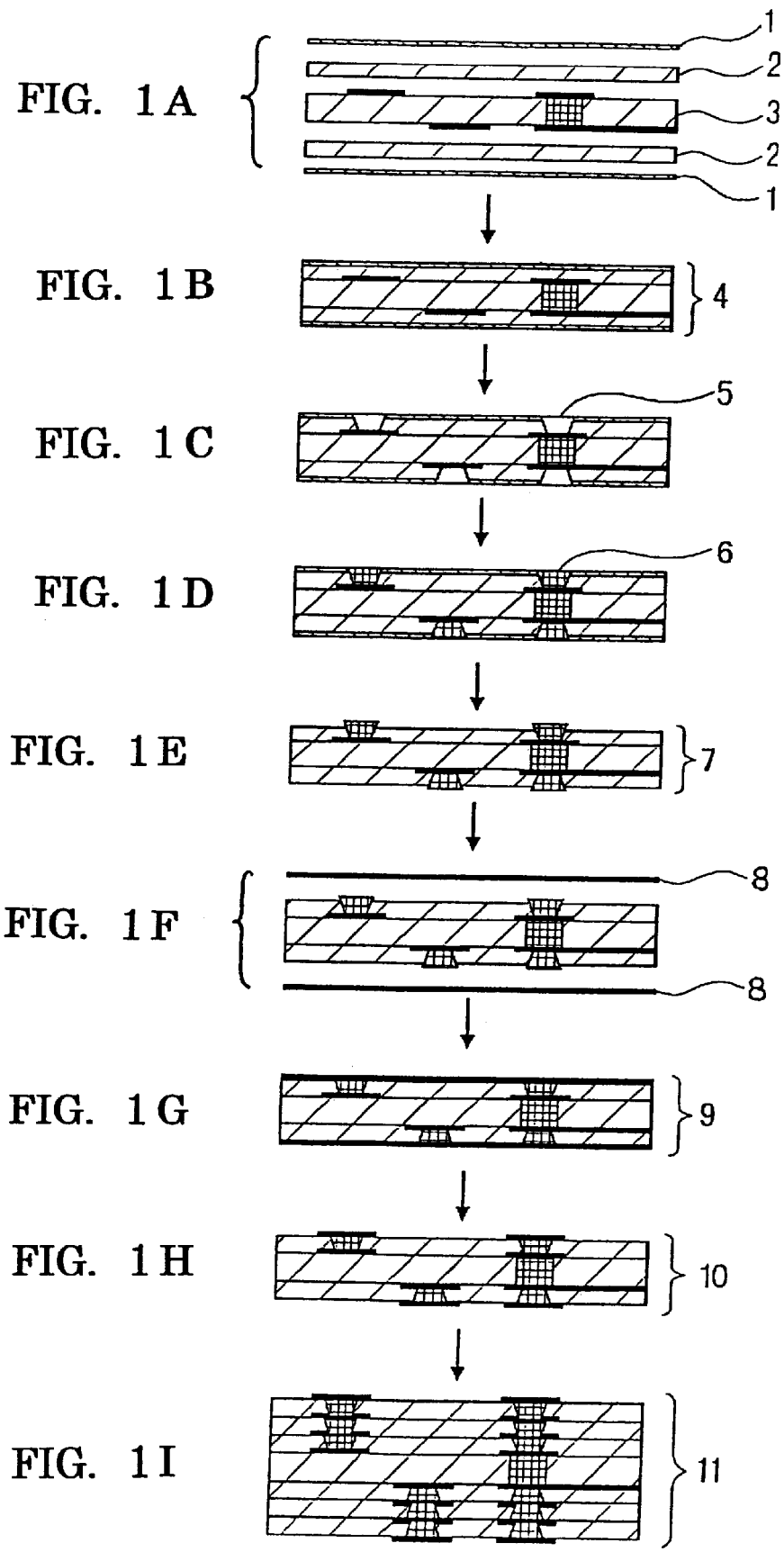
FIGS. 1A to 1I are sectional views illustrating a method of manufacturing a multi-layer printed wiring board according to the invention.
Figure 2:
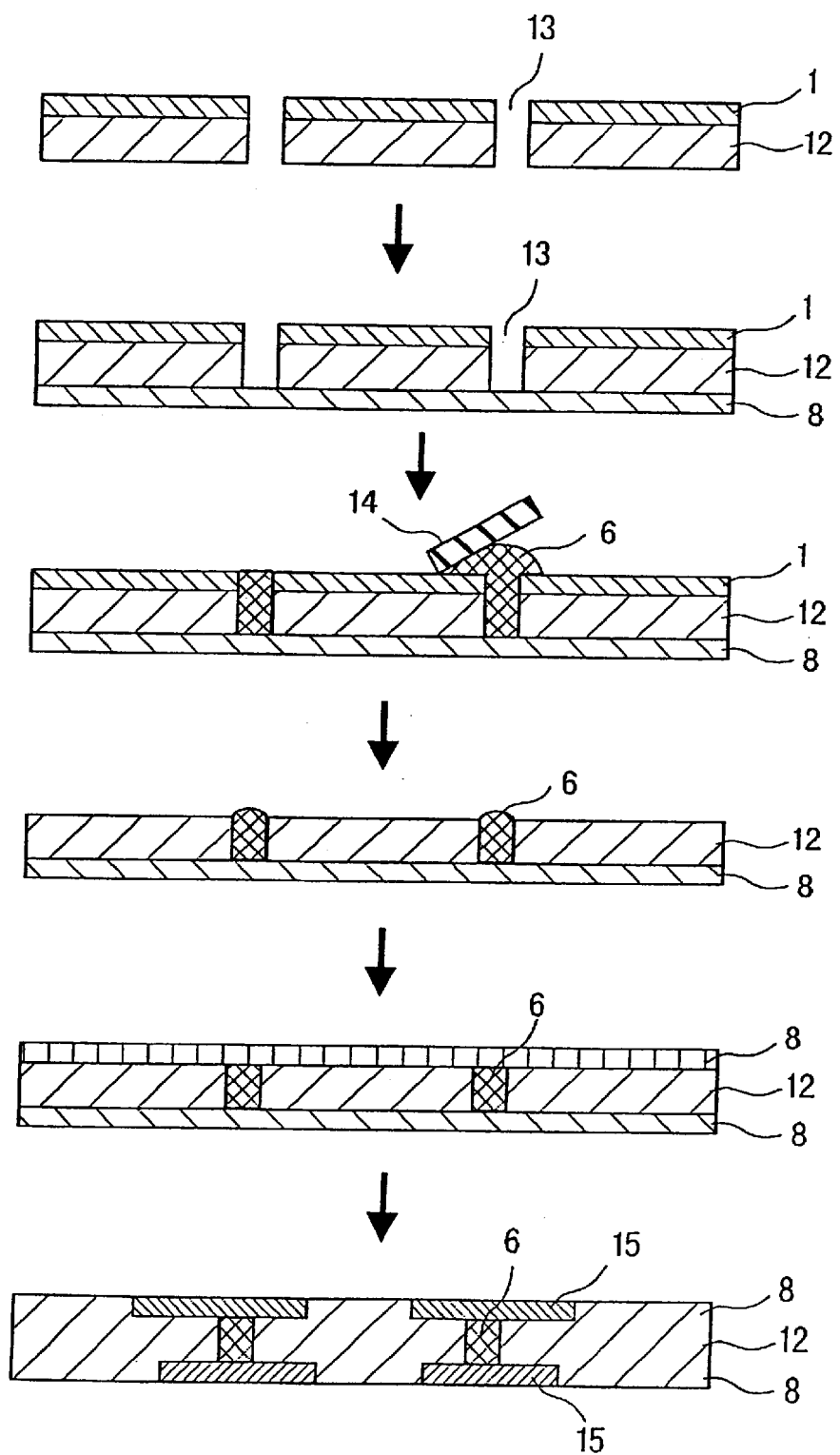
FIG. 2 is a sectional view illustrating a conventional method of manufacturing printed wiring board.

FIGS. 1A to 1I are diagrams illustrating a method of manufacturing multi-layer printed wiring board according to this invention. In FIG. 1A, an uncured resin sheet 2 and a cover film 1 having release property are stuck to both sides of a siring board 3 that has a wiring layer on both front and back surfaces, and are molded as a unitart structure by using a laminator or the like to produce a multi-layer wiring board material 4 (FIG. 1B). In the thus obtained multi-layer wiring board material 4 is then formed a non-through hole 5 by a laser beam (not shown), which is then filled with a thermosetting conductive paste 6 (FIGS. 1C and 1D). Thereafter, the thermosetting conductive paste 6 is heat-treated into a half-cured state and, then, the cover film 1 is peeled off to produce a multi-layer wiring board 7 with a conductive paste (FIG. 1E). Then, a copper foil 8 is stuck onto both surfaces of the thus obtained multi-layer wiring board 7 with conductive paste by pressing and heating by use of the laminator or the like (FIGS. 1F and 1G). The copper foils 8 on the multi-layer wiring board 9 are then etched to form predetermined circuit patterns, thereby to produce a four-layer printed wiring board 10 (FIG. 1H). By using the thus obtained multi-layer printed wiring board as a base, the above-mentioned step is repeated to produce an 8-layer printed wiring board 11 or a multi-layer printed wiring board having more layers (FIG. 1I).

When it is desired to obtain a wiring board having odd numbers of layers, the uncured resin sheet 2, copper foil 8 and cover film 1 are stuck onto one surface only to form the circuitry through the above-mentioned step.

As the uncured resin sheet used in the method of manufacturing multi-layer printed wiring board of the present invention, an epoxy resin, a BT (bismaleimide trizine) resin, a polyimide resin or a Teflon-type resin, or a mixture of two or more kinds thereof, is applied onto an organic film for a carrier film, the solvent is removed by drying and, then, the resin is half-cured.

As the uncured resin sheet, there can be used a thermosetting resin in which an inorganic filler is dispersed, a variety of composite materials such as a composite material of a glass cloth and a thermosetting resin, a composite material of a nonwoven fabric comprising chiefly a glass fiber and a thermosetting resin, a composite material of a nonwoven fabric comprising chiefly a wholly aromatic polyamide and a thermosetting resin, and a composite material of a nonwoven fabric comprising chiefly a polyacrylate-type liquid crystal polymer and a thermosetting resin. As the thermosetting resin used for these composite materials, there can be exemplified the above-mentioned epoxy resin, BT resin, polyimide resin, Teflon-type resin, or a mixture of two or more kinds thereof.

Among the uncured resin sheets using these composite materials, the thermosetting resin in which, for example, the inorganic filler is dispersed is obtained by dissolving the resin in a solvent in which a predetermined inorganic filler is dispersed, applying the solvent onto the organic film for carrier, removing the solvent by drying and half-curing the resin. The uncured resin sheet using any other composite material is obtained by impregnating a glass cloth or a nonwoven fabric with the thermosetting resin dissolved in the solvent, removing the solvent through the drying furnace and, at the same time, half-curing the resin.

As the inorganic filler, there can be used a spherical substance or a fibrous substance. However, the fibrous substance is preferably used from the standpoint of controlling the fluidity of the resin. It is desired that the content of the inorganic filler is from about 20% by weight to about 70% by weight from the two standpoint of working condition and fluidity of the resin at the time of heating with the application of pressure. When the content is smaller than 20% by weight, cracks are generated at the resin sheet bringing with the handling of the resin sheet becomes difficult and, besides, it becomes difficult to control the fluidity of the resin at the time of heating and pressurizing. When the content of the inorganic filler exceeds 70% by weight, on the other hand, the amount of the resin decreases, the adhesiveness of the uncured resin sheet decreases and, at the same time, drilling property of the through holes by using laser beam decreases. On the other hand, when the uncured resin sheet has thickness of not smaller than 30 µm, and the printed wiring board must have sufficient degree of expansion property at low temperatures and rigidity, it is desired to use a resin sheet reinforced with a fiber such as the glass cloth or the nonwoven fabric.

The uncured resin sheet reinforced with the glass fiber or the organic material is obtained by impregnating the glass cloth or the nonwoven fabric with the thermosetting resin dissolved in the solvent, and passing it through the drying furnace. The amount of the remaining solvent can be suppressed to be not larger than 0.5% by weight despite the sheet has a large thickness. When the amount of the remaining solvent exceeds 0.5%, the inner-layers of the printed wiring board peel off due to vaporization of the remaining solvent in the step of manufacturing the wiring board by pressurizing and heating, giving rise to the occurrence of defects. When a resin sheet reinforced with fiber is used, the printed wiring board is imparted with expansion property at low temperatures and rigidity, and the surface mounting is accomplished with improved reliability. In particular, distinguished effect is exhibited when there is used an inner printed wiring board having a thickness of not larger than 0.2 mm.

As the fiber material, there can be preferably used a glass cloth comprising an opened fiber in which both the warps and wefts have widths which are about 6 to 10 times as great as the thicknesses thereof, a nonwoven glass fabric comprising chiefly a glass fiber, an organic nonwoven fabric comprising chiefly a wholly aromatic polyamide, or an organic nonwoven fabric comprising chiefly a liquid crystal polymer of the polyacrylate type.

By using the glass cloth of opened fiber in which both the warps and wefts have widths which are about 6 to 10 times as great as the thicknesses thereof, it is allowed to form circuit patterns exhibiting increased surface flatness, high precision and high density, as well as to obtain property of being uniformly drilled by a laser beam. When both the warps and wefts have widths which are not more than 6 times as great as the thicknesses thereof, the surface flatness is lost and it becomes difficult to form circuit patterns maintaining high precision. Besides, the densities of the warps in the vertical direction and of the wefts undergo a change in the resin sheet. In the step of laser drilling, therefore, there occurs a difference in the number of the laser irradiating times for drilling and in the shape of the holes after drilled with the laser beam. When the widths of both the warps and wefts become in excess of 10 times as great as the thicknesses thereof, on the other hand, the surface flatness of the printed wiring board increases, but the glass yarns are fluffed in the step of producing the resin sheet, giving rise to the occurrence of twisting which greatly hinders the productivity.

By using the nonwoven glass fabric, wholly aromatic polyamide nonwoven fabric or liquid crystal polymer nonwoven fabric of the polyacrylate type, further, there is obtained a printed wiring board exhibiting further improved surface flatness, expansion property at low temperatures and rigidity though the printed wiring board becomes expensive to some extent compared with when the above glass cloth is used. Further, use of the organic nonwoven fabric such as the wholly aromatic polyamide nonwoven fabric or the liquid crystal polymer nonwoven fabric of the polyacrylate type makes it possible to decrease the weight of the printed wiring board.

It is desired that the uncured resin sheet has a thickness of about 20 to 200 µm from the standpoint of insulating property, rigidity and easiness of handling. In particular, when the thickness of the interlayer is not larger than 40 µm and the printed wiring board needs not be supplemented with expansion property at low temperatures and rigidity to a sufficient degree, there can be preferably used a resin sheet in which an inorganic filler is dispersed.

The cover film must be easily drilled with a laser beam so as to form non-through holes. Besides, the cover film must have heat resistance since it is subjected to the step of half-curing the conductive paste by heating. As the cover film, there can be used a polytetrafluoroethylene, a polyethylene terephthalate, a polypropylene, a polyethylene fluoride or a polyvinylidene fluoride.

It is desired that the thickness of the cover film is not smaller than 5 µm so that it can be laminated without developing wrinkles but is not so large from the standpoint of the working rate of laser drilling. From the standpoint of handling, however, the cover film must be thick to some extent. From such a point of view, it is desired that the cover film has a thickness of from about 10 to about 70 µm.

When the resin sheet which has not been cured is to be laminated on both surfaces of the wiring board and, besides, a cover film is to be further laminated on the surfaces thereof, a vacuum laminator is suitably used for suppressing the occurrence of voids.

The laser drilling is used for forming the non-through holes. As the laser for drilling, there can be used an excimer laser, a YAG laser or a $CO_2$ laser. Among them, the $CO_2$ laser is preferably used from the standpoint of working rate and working cost.

In the method of manufacturing multi-layer printed wiring board of the invention, the land position of the inner printed wiring board is automatically recognized by an optical method such as CCD camera or the like mounted on the laser device and, hence, there is almost no deviation in position between the non-through holes and the lands of the inner printed wiring board. By employing the method of manufacturing multi-layer printed wiring board, the diameter of lands of the inner printed wiring board can be brought close to the diameter of non-through holes, making it possible to fabricate the circuit patterns highly densely.

When the non-through holes are to be formed by using the $CO_2$ laser, the residue of resin may remain on the land surfaces of the inner printed wiring board. Usually, therefore, a processing called desmear processing is executed for removing the resin. As the desmear processing for the non-through holes, the cleaning using a plasma device is preferably executed.

The non-through holes are filled with the conductive paste preferably by screen printing or roll coater method. Thereafter, the conductive paste is half-cured by heating, and the organic cover film is peeled off. The excess of conductive paste printed around the non-through holes during the printing can be easily removed by peeling the organic cover film off.

The conductive substance used for the conductive paste chiefly comprises a powder of Cu, Ag and an alloy thereof, and exhibits a stable conductivity. It is desired that the metal foil to be stuck to the uncured resin sheet with conductive paste have a coarse surface from the standpoint of adhesion strength.

Copper, nickel, aluminum or the like makes the metal foil. As the printed wiring board, however, a copper foil is preferably used. It is desired that the metal foil has a thickness of from about 3 to about 100 $\mu$m. When the thickness is smaller than 3 $\mu$m, the foil is advantageous for forming fine patterns but arouses a problem concerning being penetrated through by a laser beam and handling. When the thickness exceeds 100 $\mu$m, on the other hand, difficulty is involved in finely forming the circuit patterns.

According to the method of manufacturing multi-layer printed wiring board of the invention, an uncured resin sheet is used as an interlayer insulating film, non-through holes are formed by laser drilling as an interlayer wiring method, the non-through holes are filled with a conductive paste and, then, a half-cured electric conductor is formed by heating, and the half-cured electric conductor and the land portions of the wiring layer are stuck together with the application of pressure and heat. Therefore, even if the resin sheet is fluidized by heating, the electric conductor and the land portions are secured together, making it possible to position the electric conductor and the land portions of the wiring layer maintaining a high precision and, hence, to produce a multi-layer printed wiring board maintaining high precision and high density.

EXAMPLE

The invention will now be described in detail by way of an Example to which only, however, the invention is in no way limited.

Example

As a reinforcing fiber, there was used a nonwoven fabric (70$\mu$-thick Thermount, produced by Du Pont-Teijin Advanced Paper Co.) produced from a para-type wholly aromatic polyamide fiber.

The epoxy resin varnish with which the nonwoven fabric is to be impregnated was prepared by blending 90 parts by weight of epoxy resin Epikote 5046 (manufactured by Yuka Shell Epoxy Co.), 10 parts by weight of Epikote 5048 (manufactured by Yuka Shell Epoxy Co.) and 2 parts by weight of a dicyanodiamide (manufactured by Nippon Carbide Co.) as a curing agent, followed by the addition of imidazole as a catalyst and methyl ethyl ketone, so that the solid components were 50 parts by weight. The base member of the nonwoven fabric was impregnated with the varnish and was dried in a drying furnace at a temperature of about 130 to 140° C. for about 7 to 15 minutes to remove the solvent and to react the impregnated resin, thereby to obtain a resin sheet.

The thus obtained resin sheet was arranged on both surfaces of a 0.2 mm-thick glass epoxy double surface-printed wiring board having circuit patterns of line/space of 75 $\mu$m/75 $\mu$m and interlayer connection lands of 110 $\mu$m so as to be opposed to the parting surfaces of 20 $\mu$m-thick polyethylene terephthalate films which were organic cover films having release property. The inner printed wiring board were stuck using the vacuum laminator at one time.

Next, non-through holes of a diameter of 100 $\mu$m were formed by using a $CO_2$ laser (6054GTX manufactured by Mitsubishi Electric Co.), and the residual of the film remaining in the non-through holes was removed by the plasma cleaning processing.

Thereafter, the non-through holes were filled with a conductive paste (DD-1801 manufactured by Kyoto Elex Co.) from the upper side of the polyethylene terephthalate film surface by the screen-printing method, followed by drying at 100° C. for 15 minutes to half-cure the conductive paste. Thereafter, the film was peeled off.

The resin sheets having copper film were overlapped with the surface in position on the double surface-printed wiring board having the conductive paste formed in the non-through holes in the resin sheet, as a unitary structure in vacuum with the application of a pressure of 30 kg/cm$^2$ and a temperature of 175° C. for 90 minutes thereby to obtain a copper-lined four-layer base plate. Thereafter, the copper foils which are the uppermost layer and the lowermost layer were etched to obtain a four-layer printed wiring board having circuit patterns of line/space of 40 $\mu$m/40 $\mu$m. The thus obtained four-layer printed wiring board exhibited a bending modulus of elasticity of 1130 kgf/mm$^2$ and a coefficient of thermal expansion in the plane direction of 11.8 ppm/° C.

According to the method of manufacturing multi-layer printed board of the invention as described above, the uncured resin sheet is used as an interlayer insulating film, and, after the drilling is executed by laser, the conductive paste formed in the interlayer insulating film is half-cured and is, then, laminated on the wiring board by the application of pressure and heat, suppressing the positional deviation between the wiring layer and the electric conductor caused by the application of pressure and heat at the time of lamination. Thus, there is obtained a highly dense multi-layer printed wiring board utilizing the highly precise positioning based on the laser working to a sufficient degree.

What is claimed is:

1. A method of manufacturing a multi-layer printed wiring board comprising, sequentially:
    adhering an adhesive uncured resin sheet to at least one surface of an inner base plate, the inner base plate having wiring layers on both of two opposed surfaces;
    irradiating a portion of said uncured resin sheet with a laser beam to form, in said uncured resin sheet, a through hole, exposing a connection portion of said wiring layer of said inner base plate;
    filling the through hole with a conductive material to form an interlayer conductor electrically connecting a front surface and a back surface of said uncured resin sheet to each other;

adhering a conductive film to a portion of the front surface of said uncured resin sheet containing said interlayer conducter;

curing said uncured resin sheet; and patterning said conductive film into a wiring shape.

2. The method of manufacturing a multi-layer printed wiring board according to claim 1, further comprising:

stacking a non-adhesive resin sheet on said uncured resin sheet prior to irradiating said uncured resin sheet with the laser beam; and peeling off said non-adhesive resin sheet after said interlayer conductor has been formed.

3. The method of manufacturing a multi-layer printed wiring board according to claim 1, in which said adhesive uncured resin sheet comprises a resin selected from the group consisting of epoxy resin, BT (bismaleimide trizine) resin, polyimide resin, Teflon-type resin, and mixtures thereof.

4. The method of manufacturing a multi-layer printed wiring board according to claim 1, further comprising, before adhering said conductive film and after filling the through hole with said conductive material, partially curing said conductive material, and, after adhering said conductive film to said uncured resin sheet, completely curing said conductive material while completing curing of said uncured resin sheet.

5. The method of manufacturing a multi-layer printed wiring board according to claim 1, wherein the through hole formed with the laser beam is tapered in cross-section.

* * * * *